US012688964B2

(12) United States Patent
Takubo et al.

(10) Patent No.: US 12,688,964 B2
(45) Date of Patent: Jul. 21, 2026

(54) MULTILAYER COIL COMPONENT

(71) Applicant: TDK CORPORATION, Tokyo (JP)

(72) Inventors: Yuichi Takubo, Tokyo (JP); Masaki Takahashi, Tokyo (JP); Youichi Kazuta, Tokyo (JP); Yuto Shiga, Tokyo (JP); Junichiro Urabe, Tokyo (JP); Noriaki Hamachi, Tokyo (JP); Kazuya Tobita, Tokyo (JP); Toshinori Matsuura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 885 days.

(21) Appl. No.: 17/514,072

(22) Filed: Oct. 29, 2021

(65) Prior Publication Data

US 2022/0139611 A1 May 5, 2022

(30) Foreign Application Priority Data

Nov. 2, 2020 (JP) ................................. 2020-183867

(51) Int. Cl.
| | |
|---|---|
| *H01F 27/29* | (2006.01) |
| *H01F 5/00* | (2006.01) |
| *H01F 17/00* | (2006.01) |
| *H01F 27/28* | (2006.01) |
| *H05K 1/181* | (2026.01) |

(52) U.S. Cl.
CPC .......... *H01F 27/292* (2013.01); *H01F 5/003* (2013.01); *H01F 17/0013* (2013.01); *H01F 27/2804* (2013.01); *H05K 1/181* (2013.01); *H05K 2201/1003* (2013.01); *H05K 2201/10977* (2013.01)

(58) Field of Classification Search
CPC ............. H01F 27/2804; H01F 17/0006; H01F 17/0013; H01F 2027/2809; H01F 5/003; H01F 27/292
USPC ................................................. 336/200, 232
See application file for complete search history.

(56) References Cited

U.S. PATENT DOCUMENTS

| | | | | |
|---|---|---|---|---|
| 2014/0078643 | A1* | 3/2014 | Odahara | H01F 27/292 156/89.12 |
| 2016/0284467 | A1* | 9/2016 | Kim | H01F 41/046 |
| 2017/0004918 | A1 | 1/2017 | Kido et al. | |
| 2018/0182535 | A1* | 6/2018 | Tachibana | H01F 17/0013 |
| 2018/0240591 | A1* | 8/2018 | Ishima | H01F 17/0013 |
| 2019/0214182 | A1* | 7/2019 | Imada | H01F 41/043 |
| 2019/0214187 | A1* | 7/2019 | Imada | H01F 17/0013 |
| 2019/0252113 | A1* | 8/2019 | Ku | H01F 17/0013 |

(Continued)

FOREIGN PATENT DOCUMENTS

| | | | |
|---|---|---|---|
| JP | S63-93601 U | 6/1988 | |
| JP | H0455124 U * | 5/1992 | ......... H01F 17/0013 |

(Continued)

*Primary Examiner* — Tszfung J Chan
(74) *Attorney, Agent, or Firm* — Oliff PLC

(57) ABSTRACT

A multilayer coil component 1 includes an element body 2, a coil 10, and a pair of terminal electrodes 3. The element body 2 has a groove portion 20 provided on a main surface 2c. The groove portion 20 is disposed between the pair of terminal electrodes 3 and extends over one side surface 2e and the other side surface 2f. The depth of the groove portion 20 in the direction in which the main surface 2c and a main surface 2d, which are a pair, face each other is smaller than the thickness of each of the pair of terminal electrodes 3 in the facing direction.

6 Claims, 7 Drawing Sheets

(56)                    References Cited

U.S. PATENT DOCUMENTS

2019/0311841 A1 * 10/2019  Watanabe  .............. H01F 41/06
2020/0066431 A1      2/2020  Shiga et al.

FOREIGN PATENT DOCUMENTS

| JP | 2010-165975 | A |   | 7/2010 | | |
| JP | 2017-017116 | A |   | 1/2017 | | |
| JP | 2018107411 | A | * | 7/2018 | ............ | H01F 27/29 |
| JP | 2019-140246 | A |   | 8/2019 | | |
| JP | 2020-031101 | A |   | 2/2020 | | |

* cited by examiner

*Fig.4*

MULTILAYER COIL COMPONENT

TECHNICAL FIELD

The present invention relates to a multilayer coil component.

BACKGROUND

The multilayer coil component described in Patent Literature 1 is known as an example of existing multilayer coil components. The multilayer coil component described in Patent Literature 1 (Japanese Unexamined Patent Publication No. 2017-17116) includes an element body having a pair of end surfaces facing each other, a pair of main surfaces facing each other, and a pair of side surfaces facing each other, in which one of the main surfaces is a mounting surface, a coil disposed in the element body with a coil axis extending along the facing direction of the pair of side surfaces, and a terminal electrode disposed over the end surface of the element body and the mounting surface and embedded in the element body.

The multilayer coil component is mounted on a circuit board or the like. In a case where the multilayer coil component is mounted on the circuit board, resin filling and curing are performed so that each component mounted on the circuit board or the like is sealed. The space between the multilayer coil component and the circuit board is also filled with resin. As a result, the occurrence of a short circuit attributable to molten solder may be suppressed in the event of subsequent repeated passage through a reflow furnace. However, in a case where the existing multilayer coil component is mounted on the circuit board, it is difficult to ensure the distance between the circuit board and the element body of the multilayer coil component. Accordingly, the space between the multilayer coil component and the circuit board is not sufficiently filled with resin and a short circuit may occur. In addition, when the distance between the multilayer coil component and the circuit board is not ensured, a cleaning liquid does not appropriately enter between the multilayer coil component and the circuit board in the process of post-reflow cleaning and a flux (accelerator) may remain without being cleaned.

SUMMARY

An object of one aspect of the present invention is to provide a multilayer coil component capable of suppressing the occurrence of a post-mounting problem.

A multilayer coil component according to one aspect of the present invention includes: an element body formed by laminating a plurality of insulator layers and having a pair of end surfaces facing each other, a pair of main surfaces facing each other, and a pair of side surfaces facing each other, one of the main surfaces being a mounting surface; a coil disposed in the element body with a coil axis extending along a facing direction of the pair of side surfaces; and a pair of terminal electrodes connected to the coil and disposed in recessed portions formed on the mounting surface on the respective end surface sides of the element body, in which the element body has a groove portion provided on the mounting surface, the groove portion is disposed between the pair of terminal electrodes and extends over one of the side surfaces and the other side surface, and a depth of the groove portion in a facing direction of the pair of main surfaces is smaller than a thickness of each of the pair of terminal electrodes in the facing direction.

In the multilayer coil component according to one aspect of the present invention, the groove portion is provided on the mounting surface of the element body. As a result, when the multilayer coil component is mounted on a circuit board or the like, a space is formed between the circuit board and the multilayer coil component by the groove portion. Accordingly, in a case where the multilayer coil component is mounted on the circuit board, the space between the element body and the circuit board can be appropriately filled with resin. In addition, a flux remaining in a cleaning process can be avoided. Accordingly, the occurrence of a post-mounting problem can be suppressed in the multilayer coil component.

In the multilayer coil component, the coil axis of the coil extends along the facing direction of the pair of side surfaces. In the multilayer coil component, it may be desired to make the diameter of the coil as large as possible for design with which a higher Q value can be obtained. In this configuration, the distance between the coil and the element body can be shortened by the element body being provided with the groove portion. Then, the thickness of the element body between the coil and the groove portion decreases, and thus the strength of the element body may decrease. In the multilayer coil component, the depth of the groove portion is smaller than the thickness of the terminal electrode. As a result, the distance between the coil and the groove portion can be ensured in the multilayer coil component. Accordingly, the strength of the element body can be ensured in the multilayer coil component.

In one embodiment, in the pair of terminal electrodes, end portions facing each other in a facing direction of the pair of end surfaces may be curved when viewed from the facing direction of the pair of side surfaces. In this configuration, the end portion has a curved shape (rounded shape), and thus the volume of the end portion of the terminal electrode can be reduced as compared with a case where the end portion has a rectangular shape. Accordingly, in the multilayer coil component, the volume of the element body (element body region) can be ensured and thus the strength of the element body can be ensured.

In one embodiment, the groove portion may have a pair of side surface parts facing each other in a facing direction of the pair of end surfaces, a bottom surface part connecting the pair of side surface parts, and a connecting part connecting the pair of side surface parts and the bottom surface part, and the connecting part may be curved. In a case where the side surface part and the bottom surface part intersect linearly, resin may not enter the connecting part. In the multilayer coil component, resin is capable of entering the connecting part as well by the connecting part being curved. Accordingly, the space between the element body and the circuit board can be appropriately filled with resin. In addition, by the connecting part having a curved shape, the stress that is applied to the element body by the circuit board bending can be dispersed. Accordingly, cracking of the element body can be suppressed.

In one embodiment, a plurality of the groove portions may be provided. In this configuration, the strength of the element body can be ensured and the space between the element body and the circuit board can be appropriately filled with resin.

In one embodiment, the element body may exist between the pair of terminal electrodes and the groove portion when viewed from the facing direction of the pair of side surfaces. The strength of the element body can be ensured in this configuration.

According to one aspect of the present invention, the occurrence of a post-mounting problem can be suppressed.

BRIEF DESCRIPTION OF THE DRAWINGS

FIG. 4 is a diagram illustrating a mounted structure of the multilayer coil component.

DETAILED DESCRIPTION

Figure 1:
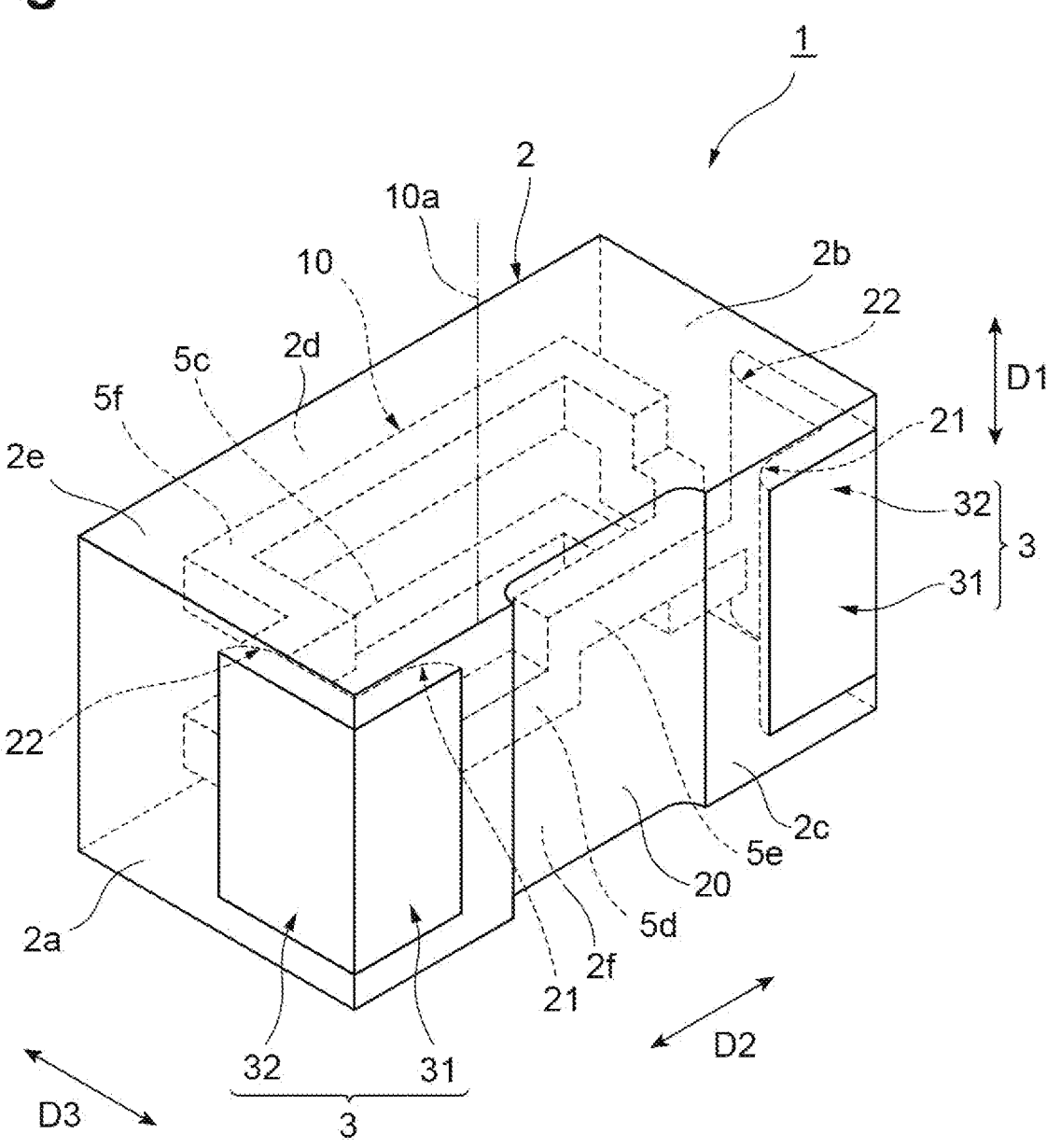
FIG. 1 is a perspective view of a multilayer coil component according to an embodiment.

Hereinafter, a preferred embodiment of the present invention will be described in detail with reference to the accompanying drawings. It should be noted that the same or equivalent elements in the description of the drawings are denoted by the same reference numerals with redundant description omitted.

Figure 2:
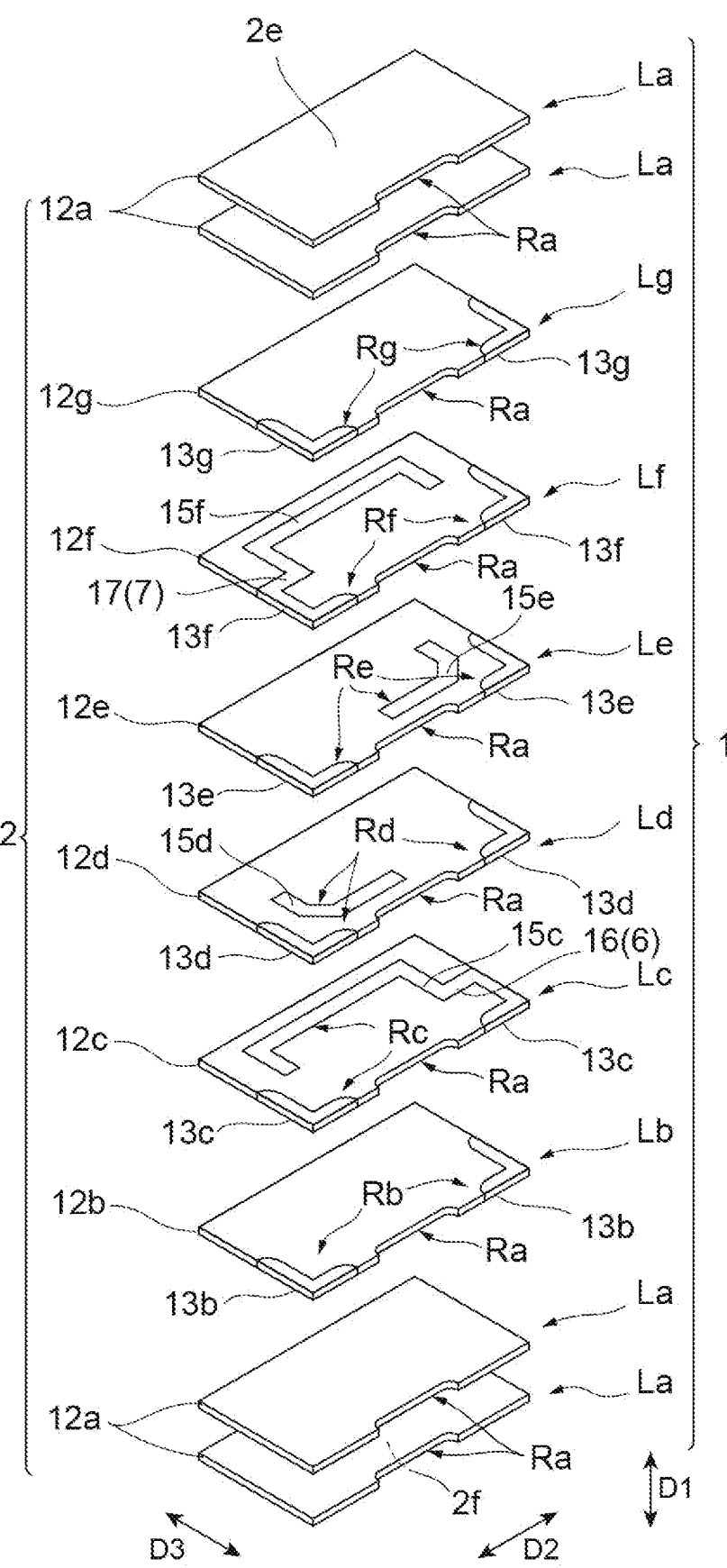
FIG. 2 is an exploded perspective view of the multilayer coil component of FIG. 1.
Figure 3:
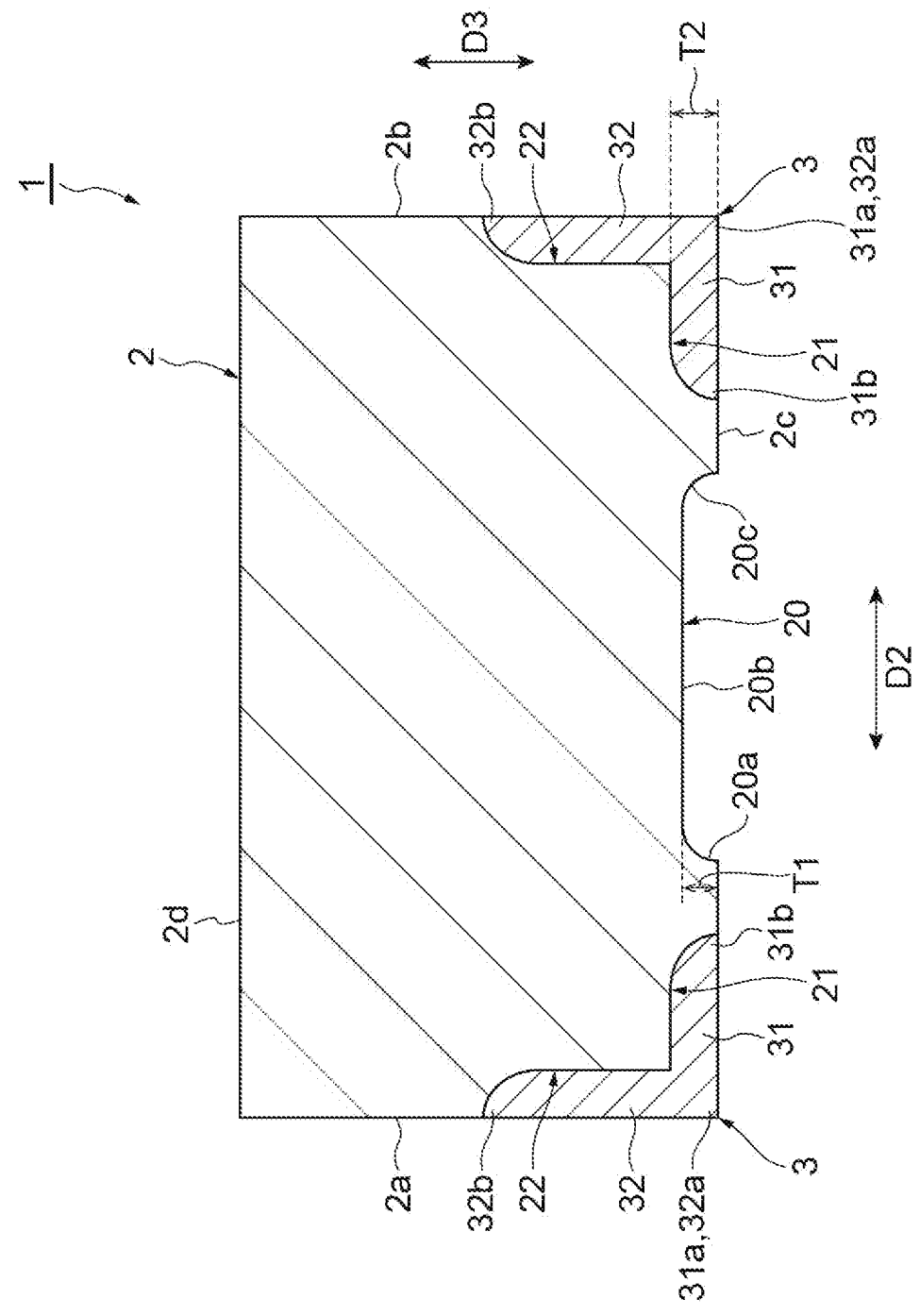
FIG. 3 is a diagram illustrating a cross-sectional configuration of the multilayer coil component.

A multilayer coil component according to an embodiment will be described with reference to FIGS. 1 to 3. FIG. 1 is a perspective view of a multilayer coil component according to an embodiment. FIG. 2 is an exploded perspective view of the multilayer coil component of FIG. 1. FIG. 3 is a diagram illustrating a cross-sectional configuration of the multilayer coil component.

As illustrated in FIGS. 1 and 2, a multilayer coil component 1 according to the embodiment includes an element body 2, a pair of terminal electrodes 3, a plurality of coil conductors 5c, 5d, 5e, and 5f, and connecting conductors 6 and 7.

The element body 2 has a rectangular parallelepiped shape. The rectangular parallelepiped shape includes a rectangular parallelepiped shape in which the corner and ridge portions are chamfered and a rectangular parallelepiped shape in which the corner and ridge portions are rounded. The element body 2 has end surfaces 2a and 2b, main surfaces 2c and 2d, and side surfaces 2e and 2f as outer surfaces. The end surfaces 2a and 2b face each other. The main surfaces 2c and 2d face each other. The side surfaces 2e and 2f face each other. In the following description, the direction in which the side surfaces 2e and 2f face each other is a first direction D1, the direction in which the end surfaces 2a and 2b face each other is a second direction D2, and the direction in which the main surfaces 2c and 2d face each other is a third direction D3. The first direction D1, the second direction D2, and the third direction D3 are substantially orthogonal to each other.

The end surfaces 2a and 2b extend in the third direction D3 so as to connect the main surfaces 2c and 2d. In addition, the end surfaces 2a and 2b extend in the first direction D1 so as to connect the side surfaces 2e and 2f. The main surfaces 2c and 2d extend in the second direction D2 so as to connect the end surfaces 2a and 2b. In addition, the main surfaces 2c and 2d extend in the first direction D1 so as to connect the side surfaces 2e and 2f. The side surfaces 2e and 2f extend in the third direction D3 so as to connect the main surfaces 2c and 2d. In addition, the side surfaces 2e and 2f extend in the second direction D2 so as to connect the end surfaces 2a and 2b.

The main surface 2c is a mounting surface and is a surface facing another electronic device (not illustrated) when, for example, the multilayer coil component 1 is mounted on the electronic device (such as a circuit base material and a multilayer electronic component). The end surfaces 2a and 2b are surfaces continuous from the mounting surface (that is, the main surface 2c).

The length of the element body 2 in the second direction D2 is longer than the length of the element body 2 in the third direction D3 and the length of the element body 2 in the first direction D1. The length of the element body 2 in the third direction D3 and the length of the element body 2 in the first direction D1 are equivalent to each other. In other words, in the present embodiment, the end surfaces 2a and 2b have a square shape and the main surfaces 2c and 2d and the side surfaces 2e and 2f have a rectangular shape. The length of the element body 2 in the second direction D2 may be equivalent to or shorter than the length of the element body 2 in the third direction D3 and the length of the element body 2 in the first direction D1. The length of the element body 2 in the third direction D3 and the length of the element body 2 in the first direction D1 may be different from each other.

It should be noted that "equivalent" in the present embodiment may mean not only "equal" but also a value including a slight difference, a manufacturing error, or the like in a preset range. For example, it is defined that a plurality of values are equivalent insofar as the plurality of values are included in the range of 95% to 105% of the average value of the plurality of values.

As illustrated in FIGS. 1 and 3, the element body 2 has a groove portion 20. The groove portion 20 is provided on the main surface 2c (mounting surface). The groove portion 20 is disposed between the pair of terminal electrodes 3. The groove portion 20 is formed from one side surface 2e to the other side surface 2f. In other words, the groove portion 20 penetrates (goes through) the pair of side surfaces 2e and 2f. The groove portion 20 is formed linearly along the first direction D1. The width of the groove portion 20 (length in the second direction D2) is substantially constant (equivalent) over the first direction D1. The groove portion 20 has a rectangular shape when viewed from the third direction D3. The groove portion 20 is recessed from the main surface 2c toward the main surface 2d side. In the second direction D2, the width of the groove portion 20 is shorter than the distance between the pair of terminal electrodes 3 (conductor parts 31). As a result, the element body 2 exists (there is an element body region) between the groove portion 20 and the terminal electrode 3.

As illustrated in FIG. 3, the groove portion 20 has a substantially trapezoidal shape when viewed from the first direction D1. The groove portion 20 includes side surface parts 20a facing each other in the second direction D2, a bottom surface part 20b connecting the side surface parts 20a, and a connecting part (corner portion) 20c connecting the side surface part 20a and the bottom surface part 20b. The bottom surface part 20b is, for example, a flat surface. In the present embodiment, the connecting part 20c has a rounded shape (curved shape). The connecting part 20c has a predetermined curvature. It should be noted that the groove portion 20 may have a semicircular shape or the like. In addition, the groove portion 20 may not be rounded at the connecting part 20c. For example, the groove portion 20 may have a trapezoidal shape in which the side surface part 20a is linearly tapered, a rectangular shape, or the like. It should be noted that a coil 10 is not illustrated in FIG. 3.

In the present embodiment, a depth T1 of the groove portion 20 in the third direction D3 is smaller than a thickness T2 of the conductor part 31 of the terminal electrode 3 in the third direction D3 (T1<T2). The depth T1 of the groove portion 20 is the distance between the main surface 2c and the bottom surface part 20b in the third direction D3. The depth T1 is a maximum depth. The thickness T2 of the conductor part 31 of the terminal electrode 3 is the distance between a surface flush with the main surface 2c and a surface facing the surface in the third direction D3. The surface roughness of the groove portion 20 is, for example, 0.1 um to 1.0 um. The surface roughness of the groove portion 20 may be smaller than the surface roughness of the main surface 2c. The surface roughness of the groove portion 20 may be smaller than the surface roughness of the main surface 2d.

A pair of recessed portions 21 and a pair of recessed portions 22 are provided on the outer surface of the element body 2. Specifically, one recessed portion 21 is provided on the end surface 2a side of the main surface 2c and is recessed toward the main surface 2d. The other recessed portion 21 is provided on the end surface 2b side of the main surface 2c and is recessed toward the main surface 2d. One recessed portion 22 is provided on the main surface 2c side of the end surface 2a and is recessed toward the end surface 2b. The other recessed portion 22 is provided on the main surface 2c side of the end surface 2b and is recessed toward the end surface 2a.

One recessed portion 21 and one recessed portion 22 are continuously provided and correspond to one terminal electrode 3. The other recessed portion 21 and the other recessed portion 22 are continuously provided and correspond to the other terminal electrode 3. The recessed portion 21 and the recessed portion 22 have, for example, the same shape. In the present embodiment, the recessed portion 21 and the recessed portion 22 have different shapes in that the width of the recessed portion 21 (length in the second direction D2) is shorter than the width of the recessed portion 22 (length in the third direction D3). The pair of recessed portions 21 and the pair of recessed portions 22 are provided apart from the main surface 2d and the side surfaces 2e and 2f. The pair of recessed portions 21 are provided apart from each other in the second direction D2.

As illustrated in FIG. 2, the element body 2 is formed by laminating a plurality of element body layers (plurality of insulator layers) 12a to 12g in the first direction D1. In other words, the lamination direction of the element body 2 is the first direction D1. The configuration of the lamination will be described in detail later. In the actual element body 2, the plurality of element body layers 12a to 12g are integrated to the extent that the boundaries between the layers cannot be visually recognized. The element body layers 12a to 12g are made of, for example, a magnetic material (Ni—Cu—Zn-based ferrite material, Ni—Cu—Zn—Mg-based ferrite material, Ni—Cu-based ferrite material, or the like). The magnetic material constituting the element body layers 12a to 12g may contain a Fe alloy or the like. The element body layers 12a to 12g may be made of a non-magnetic material (glass ceramic material, dielectric material, or the like).

The terminal electrode 3 is provided on the element body 2. Specifically, the terminal electrode 3 is disposed in the recessed portions 21 and 22. More specifically, one terminal electrode 3 is disposed in one recessed portion 21 and one recessed portion 22 and the other terminal electrode 3 is disposed in the other recessed portion 21 and the other recessed portion 22. The pair of terminal electrodes 3 have, for example, the same shape. In the present embodiment, the conductor part 31 and a conductor part 32 have different shapes in that the width of the conductor part 31 (length in the second direction D2) is shorter than the width of the conductor part 32 (length in the third direction D3). The pair of terminal electrodes 3 are provided on the element body 2 and apart from each other in the second direction D2. The terminal electrode 3 is formed by laminating a plurality of terminal electrode layers 13b, 13c, 13d, 13e, 13f, and 13g in the first direction D1. In other words, the lamination direction of the terminal electrode layers 13b to 13g is the first direction D1. In the actual terminal electrode 3, the plurality of terminal electrode layers 13b to 13g are integrated to the extent that the boundaries between the layers cannot be visually recognized.

The terminal electrode 3 has an L shape when viewed from the first direction D1 (see FIG. 1). The terminal electrode 3 has the conductor part 31 and the conductor part 32 provided integrally with each other. The conductor part 31 extends in the second direction D2. The conductor part 31 extends in the third direction D3. The conductor part 31 is disposed in the recessed portion 21. The conductor part 32 is disposed in the recessed portion 22. The conductor parts 31 and 32 have a substantially rectangular plate shape.

The conductor part 31 includes an end portion 31a and an end portion 31b facing each other in the second direction D2. The conductor part 32 includes an end portion 32a and an end portion 32b facing each other in the third direction D3. The end portion 31a and the end portion 32a are interconnected and are provided integrally with each other. The corner portions disposed in the element body 2 in the end portion 31b and the end portion 32b have a rounded shape. In other words, the bottom surfaces of the recessed portion 21 and the recessed portion 22 are curved in the end portion 31b and the end portion 32b. It should be noted that the corner portions disposed in the element body 2 in the end portion 31b and the end portion 32b may not be rounded and the bottom surfaces of the recessed portion 21 and the recessed portion 22 may be flat surfaces.

The terminal electrode 3 may be provided with a plating layer (not illustrated) containing, for example, Ni, Sn, Au, and so on by electroplating or electroless plating. The plating layer may have, for example, a Ni plating film containing Ni and covering the terminal electrode 3 and an Au plating film containing Au and covering the Ni plating film.

The plurality of coil conductors 5c to 5f illustrated in FIG. 1 are interconnected and constitute the coil 10 in the element body 2. A coil axis 10a of the coil 10 is provided along the first direction D1. The coil conductors 5c to 5f are disposed so as to overlap at least in part when viewed from the first direction D1. The coil conductors 5c to 5f are disposed apart from the end surfaces 2a and 2b, the main surfaces 2c and 2d, and the side surfaces 2e and 2f.

The coil conductors 5c to 5f are configured by laminating a plurality of coil conductor layers 15c, 15d, 15e, and 15f in the first direction D1. In other words, the plurality of coil conductor layers 15c to 15f are disposed so as to overlap in entirety when viewed from the first direction D1. The coil conductors 5c to 5f may be configured by one coil conductor layer 15c to 15f. It should be noted that only one coil conductor layer 15c to 15f is illustrated in FIG. 2. In the actual coil conductors 5c to 5f, the plurality of coil conductor layers 15*c* to 15*f* are integrated to the extent that the boundaries between the layers cannot be visually recognized.

The connecting conductor 6 extends in the second direction D2 and is connected to the coil conductor 5*c* and the other conductor part 32. The connecting conductor 7 extends in the second direction D2 and is connected to the coil conductor 5*f* and one conductor part 32. The connecting conductors 6 and 7 are configured by laminating a plurality of connecting conductor layers 16 and 17 in the first direction D1. It should be noted that only one connecting conductor layer 16 and 17 is illustrated in FIG. 2. In the actual connecting conductors 6 and 7, the plurality of connecting conductor layers 16 and 17 are integrated to the extent that the boundary between the layers cannot be visually recognized.

The terminal electrode layers 13*b* to 13*g*, the coil conductor layers 15*c* to 15*f*, and the connecting conductor layers 16 and 17 described above are made of a conductive material (such as Ag or Pd). Each of the layers may be made of the same material or may be made of different materials.

The multilayer coil component 1 includes a plurality of layers La, Lb, Lc, Ld, Le, Lf, and Lg. The multilayer coil component 1 is configured by, for example, laminating two layers La, one layer Lb, three layers Lc, three layers Ld, three layers Le, three layers Lf, one layer Lg, and two layers La in order from the side surface 2*f* side. It should be noted that one is illustrated and the other two are not illustrated in FIG. 2 regarding each of the three layers Lc, the three layers Ld, the three layers Le, and the three layers Lf.

The element body layer 12*a* constitutes the layer La. The element body layer 12*a* is provided with a defective portion Ra.

The layer Lb is configured by combining the element body layer 12*b* and the pair of terminal electrode layers 13*b* with each other. The element body layer 12*b* is provided with a defective portion Rb corresponding in shape to the pair of terminal electrode layers 13*b*. The pair of terminal electrode layers 13*b* are fitted into the defective portion Rb. The element body layer 12*b* is provided with the defective portion Ra. The element body layer 12*b* and the pair of terminal electrode layers 13*b* as a whole have a mutually complementary relationship.

The layer Lc is configured by combining the element body layer 12*c* and the pair of terminal electrode layers 13*c* and the coil conductor layer 15*c* with each other. The element body layer 12*c* is provided with a defective portion Rc corresponding in shape to the pair of terminal electrode layers 13 and the coil conductor layer 15*c*. The pair of terminal electrode layers 13*c*, the coil conductor layer 15*c*, and the connecting conductor layer 16 are fitted into the defective portion Rc. The element body layer 12*c* is provided with the defective portion Ra. The element body layer 12*c* and the pair of terminal electrode layers 13*c*, the coil conductor layer 15*c*, and the connecting conductor layer 16 as a whole have a mutually complementary relationship.

The layer Ld is configured by combining the element body layer 12*d* and the pair of terminal electrode layers 13*d* and the coil conductor layer 15*d* with each other. The element body layer 12*d* is provided with a defective portion Rd corresponding in shape to the pair of terminal electrode layers 13*d* and the coil conductor layer 15*d*. The pair of terminal electrode layers 13*d* and the coil conductor layer 15*d* are fitted into the defective portion Rd. The element body layer 12*d* is provided with the defective portion Ra. The element body layer 12*d* and the pair of terminal electrode layers 13*d* and the coil conductor layer 15*d* as a whole have a mutually complementary relationship.

The layer Le is configured by combining the element body layer 12*e* and the pair of terminal electrode layers 13*e* and the coil conductor layer 15*e* with each other. The element body layer 12*e* is provided with a defective portion Re corresponding in shape to the pair of terminal electrode layers 13*e* and the coil conductor layer 15*e*. The pair of terminal electrode layers 13*e* and the coil conductor layer 15*e* are fitted into the defective portion Re. The element body layer 12*e* is provided with the defective portion Ra. The element body layer 12*e* and the pair of terminal electrode layers 13*e* and the coil conductor layer 15*e* as a whole have a mutually complementary relationship.

The layer Lf is configured by combining the element body layer 12*f* and the pair of terminal electrode layers 13*f*, the coil conductor layer 15*f*, and the connecting conductor layer 17 with each other. The element body layer 12*f* is provided with a defective portion Rf corresponding in shape to the pair of terminal electrode layers 13, the coil conductor layer 15*f*, and the connecting conductor layer 17. The pair of terminal electrode layers 13*f*, the coil conductor layer 15*f*, and the connecting conductor layer 17 are fitted into the defective portion Rf. The element body layer 12*f* is provided with the defective portion Ra. The element body layer 12*f* and the pair of terminal electrode layers 13, the coil conductor layer 15*f*, and the connecting conductor layer 17 as a whole have a mutually complementary relationship.

The layer Lg is configured by combining the element body layer 12*g* and the pair of terminal electrode layers 13*g* with each other. The element body layer 12*g* is provided with a defective portion Rg corresponding in shape to the pair of terminal electrode layers 13*g*. The pair of terminal electrode layers 13*g* are fitted into the defective portion Rg. The element body layer 12*g* is provided with the defective portion Ra. The element body layer 12*g* and the pair of terminal electrode layers 13*g* as a whole have a mutually complementary relationship.

The defective portion Ra is integrated and constitutes the groove portion 20 described above. The defective portions Rb, Rc, Rd, Re, Rf, and Rg are integrated and constitute the pair of recessed portions 21 and the pair of recessed portions 22 described above. Basically, the width of the defective portions Rb to Rg (hereinafter, the width of the defective portion) is set to be wider than the width of the terminal electrode layers 13*b* to 13*g*, the coil conductor layers 15*c* to 15*f*, and the connecting conductor layers 16 and 17 (hereinafter, the width of the conductor portion). The width of the defective portion may be intentionally set to be narrower than the width of the conductor portion so that adhesiveness is improved between the element body layers 12*b*, 12*c*, 12*d*, 12*e*, 12*f*, and 12*g* and the terminal electrode layers 13*b* to 13*g*, the coil conductor layers 15*c* to 15*f*, and the connecting conductor layers 16 and 17. The value obtained by subtracting the width of the conductor portion from the width of the defective portion is, for example, preferably −3 μm or more and 10 μn or less and more preferably 0 μm or more and 10 μm or less.

An example of how to manufacture the multilayer coil component 1 according to the embodiment will be described.

First, an element body forming layer is formed by applying element body paste containing the material constituting the element body layers 12*a* to 12*g* described above and a photosensitive material onto a base material (such as a PET film). The photosensitive material contained in the element body paste may be either a negative-type photosensitive material or a positive-type photosensitive material, and known photosensitive materials can be used. Subsequently, the element body forming layer is exposed and developed by, for example, a photolithography method using a Cr mask. Then, an element body pattern from which a shape corresponding to the shape of the conductor forming layer to be described later is removed is formed on the base material. The element body pattern is a layer that becomes the element body layers 12b to 12g after heat treatment. In other words, an element body pattern provided with a defective portion that becomes the defective portions Ra to Rg is formed. It should be noted that "photolithography method" of the present embodiment may be any by which a layer that contains a photosensitive material and is to be processed is processed into a desired pattern by exposure and development and is not limited to the type of the mask and so on.

Meanwhile, the conductor forming layer is formed by applying conductor paste containing the materials constituting the terminal electrode layers 13b to 13g, the coil conductor layers 15c to 15f, and the connecting conductor layers 16 and 17 described above and a photosensitive material onto a base material (such as a PET film). The photosensitive material contained in the conductor paste may be either a negative-type photosensitive material or a positive-type photosensitive material, and known photosensitive materials can be used. Subsequently, the conductor forming layer is exposed and developed by, for example, a photolithography method using a Cr mask and a conductor pattern is formed on the base material. The conductor pattern is a layer that becomes the terminal electrode layers 13b to 13g, the coil conductor layers 15c to 15g, and the connecting conductor layers 16 and 17 after heat treatment.

Subsequently, the element body forming layer is transferred from the base material onto a support body. In the present embodiment, two element body forming layers are laminated on the support body by repeating the element body forming layer transfer process twice. The element body forming layers become the layer La after heat treatment.

Subsequently, the conductor pattern and the element body pattern are repeatedly transferred onto the support body. As a result, the conductor pattern and the element body pattern are laminated in the first direction D1. Specifically, first, the conductor pattern is transferred from the base material onto the element body forming layer. Next, the element body pattern is transferred from the base material onto the element body forming layer. The conductor pattern is combined with the defective portion of the element body pattern, and the element body pattern and the conductor pattern become the same layer on the element body forming layer. Further, the conductor pattern and element body pattern transfer process is repeatedly performed and the conductor pattern and the element body pattern are laminated in a state of being combined with each other. As a result, the layers that become the layers Lb to Lg after heat treatment are laminated.

Subsequently, the element body forming layer is transferred from the base material onto the layer laminated in the conductor pattern and element body pattern transfer process. In the present embodiment, two element body forming layers are laminated on the layer by repeating the element body forming layer transfer process twice. The element body forming layers become the layer La after heat treatment.

In this manner, the laminate that constitutes the multilayer coil component 1 after heat treatment is formed on the support body. Subsequently, the obtained laminate is cut into a predetermined size. Then, heat treatment is performed after binder removal treatment is performed on the cut laminate. The heat treatment temperature is, for example, approximately 850 to 900° C. As a result, the multilayer coil component 1 is obtained. If necessary, a plating layer may be provided by performing electroplating or electroless plating on the terminal electrode 3 after the heat treatment.

Figure 4:
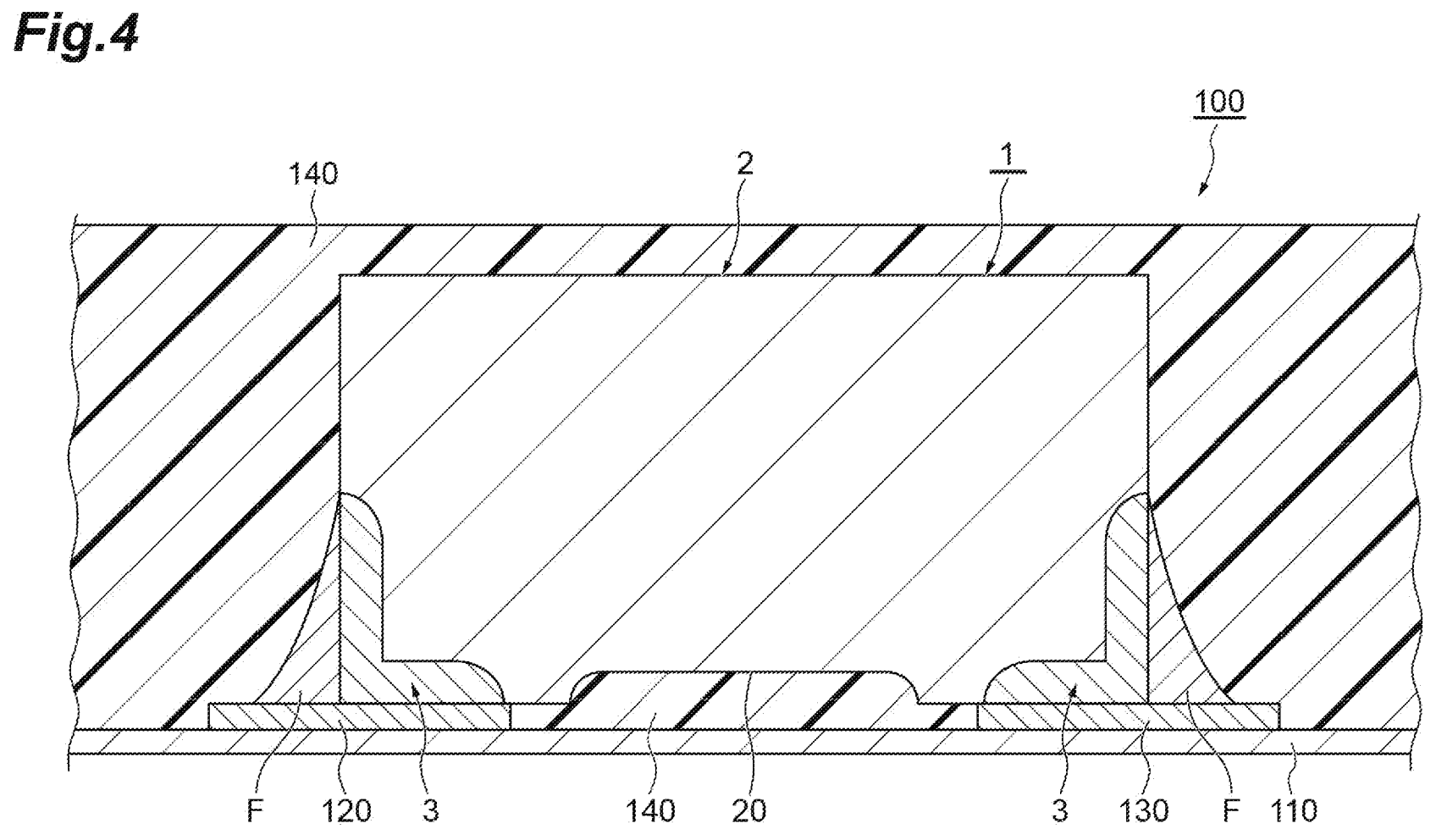

FIG. 4 is a diagram illustrating a mounted structure 100 of the multilayer coil component 1. As illustrated in FIG. 4, in the mounted structure 100, the multilayer coil component 1 is mounted with solder F on land electrodes 120 and 130 provided on a circuit board 110. One terminal electrode 3 of the multilayer coil component 1 is fixed to the land electrode 120 with the solder F. The other terminal electrode 3 of the multilayer coil component 1 is fixed to the land electrode 130 with the solder F. The mounted structure 100 is filled with mold resin 140 such that the multilayer coil component 1 is covered. The mounted structure 100 is filled with the mold resin 140 such that the multilayer coil component 1 is completely covered. The space between the circuit board 110 and the element body 2 of the multilayer coil component 1 is also filled with the mold resin 140. Specifically, the space between the circuit board 110 and the main surface 2c and the groove portion 20 of the element body 2 is filled with the mold resin 140. It should be noted that the coil 10 is not illustrated in FIG. 4.

As described above, in the multilayer coil component 1 according to the present embodiment, the groove portion 20 is provided on the main surface 2c (mounting surface) of the element body 2. As a result, when the multilayer coil component 1 is mounted on the circuit board 110, a space is formed between the circuit board 110 and the multilayer coil component 1 by the groove portion 20. Accordingly, in a case where the multilayer coil component 1 is mounted on the circuit board 110, the space between the element body 2 and the circuit board 110 can be appropriately filled with the mold resin 140. In addition, a flux remaining in a cleaning process can be avoided. Accordingly, the occurrence of a post-mounting problem can be suppressed in the multilayer coil component 1.

In the multilayer coil component 1, the coil axis 10a of the coil 10 extends along the first direction D1. In the multilayer coil component 1, it may be desired to make the diameter of the coil 10 as large as possible for design with which a higher Q value can be obtained. In this configuration, the distance between the coil 10 and the element body 2 can be shortened by the element body 2 being provided with the groove portion 20. Then, the thickness of the element body 2 between the coil 10 and the groove portion 20 decreases, and thus the strength of the element body 2 may decrease. In the multilayer coil component 1, the depth T1 of the groove portion 20 is smaller than the thickness T2 of the conductor part 31 of the terminal electrode 3. As a result, the distance between the coil 10 and the groove portion 20 can be ensured in the multilayer coil component 1. Accordingly, the strength of the element body 2 can be ensured in the multilayer coil component 1.

As for each of the pair of terminal electrodes 3 in the multilayer coil component 1 according to the present embodiment, the end portion 31b of the conductor part 31 is curved when viewed from the first direction D1. In this configuration, the end portion 31b has a curved shape (rounded shape), and thus the volume of the end portion 31b can be reduced as compared with a case where the end portion 31b has a rectangular shape. Accordingly, in the multilayer coil component 1, the volume of the element body 2 (element body region) can be ensured and thus the strength of the element body 2 can be ensured.

In the multilayer coil component 1 according to the present embodiment, the groove portion 20 has the pair of side surface parts 20*a* facing each other in the facing direction of the pair of end surfaces, the bottom surface part 20*b* connecting the pair of side surface parts 20*a*, and the connecting part 20*c* connecting the pair of side surface parts 20*a* and the bottom surface part 20*b*. The connecting part 20*c* is curved. In this configuration, resin is capable of entering the connecting part 20*c* as well by the connecting part 20*c* being curved. Accordingly, the space between the element body 2 and the circuit board 110 can be appropriately filled with the mold resin 140. In addition, by the connecting part 20*c* having a curved shape, the stress that is applied to the element body 2 by the circuit board 110 bending can be dispersed. Accordingly, cracking of the element body 2 can be suppressed.

In the multilayer coil component 1 according to the present embodiment, the element body exists between the pair of terminal electrodes 3 and the groove portion 20 when viewed from the first direction D1. The strength of the element body 2 can be ensured in this configuration.

Although an embodiment of the present invention has been described above, the present invention is not necessarily limited to the embodiment described above and various modifications can be made without departing from the gist thereof.

A form in which the terminal electrode 3 has the conductor part 31 and the conductor part 32 has been described as an example in the embodiment described above. However, the terminal electrode 3 may have at least the conductor part 31.

A form in which the end portion 31*b* of the conductor part 31 and the end portion 32*b* of the conductor part 32 are curved has been described as an example in the embodiment described above. However, the end portion 31*b* and the end portion 32*b* may have another shape without being curved.

Figure 5:
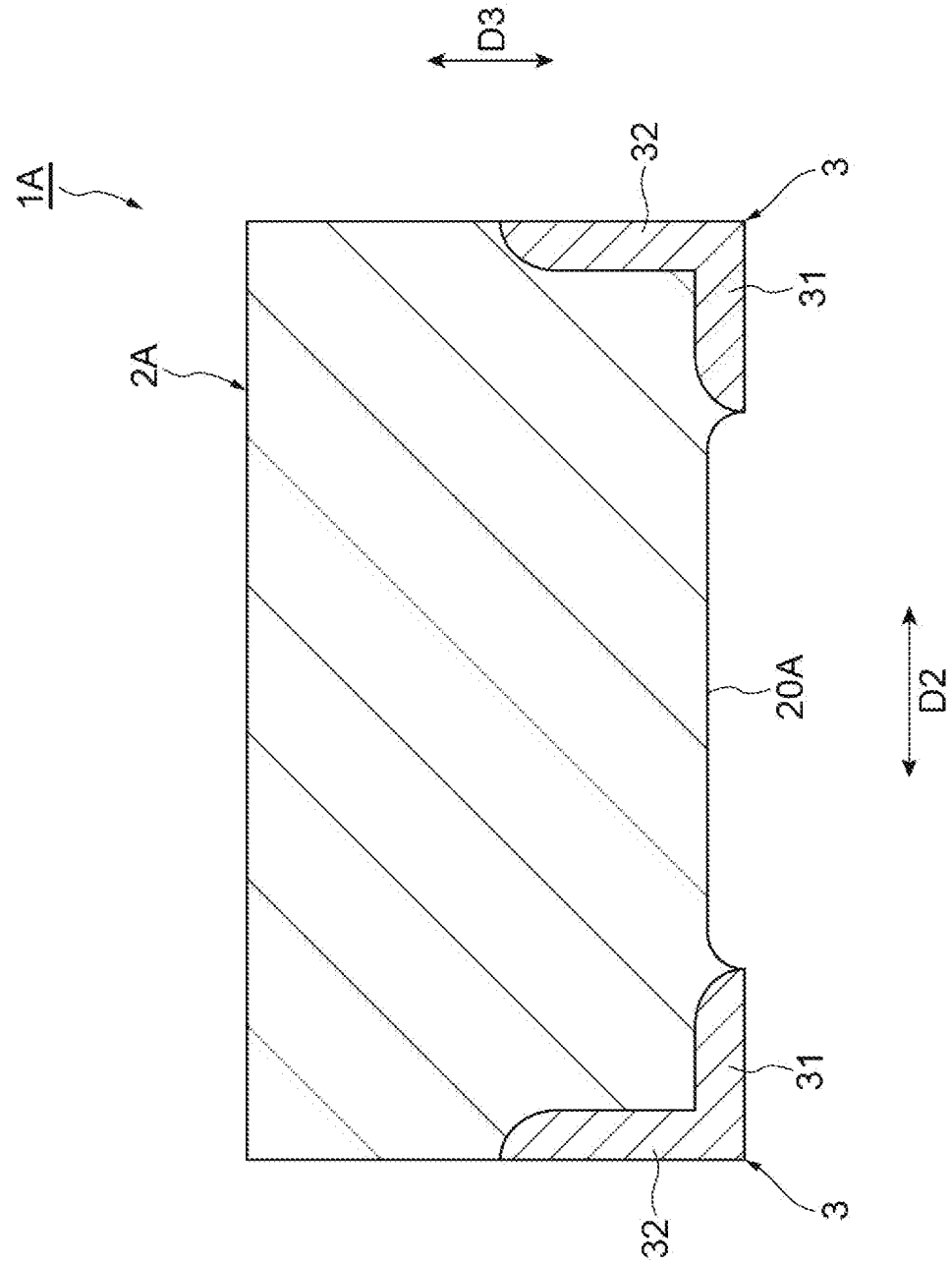
FIG. 5 is a diagram illustrating a cross-sectional configuration of a multilayer coil component according to another embodiment.

A form in which the width of the groove portion 20 is smaller than the distance between the pair of terminal electrodes 3 has been described as an example in the embodiment described above. In other words, a form in which the element body 2 exists between the groove portion 20 and the terminal electrode 3 (conductor part 31) has been described as an example. However, the width of a groove portion 20A provided in an element body 2A may be equivalent to the distance between the pair of terminal electrodes 3 as in a multilayer coil component 1A illustrated in FIG. 5. In other words, the element body 2 may not exist between the groove portion 20 and the terminal electrode 3 (conductor part 31). In this configuration, the space formed by the groove portion 20A becomes large, and thus filling with the mold resin 140 can be further performed.

Figure 6:
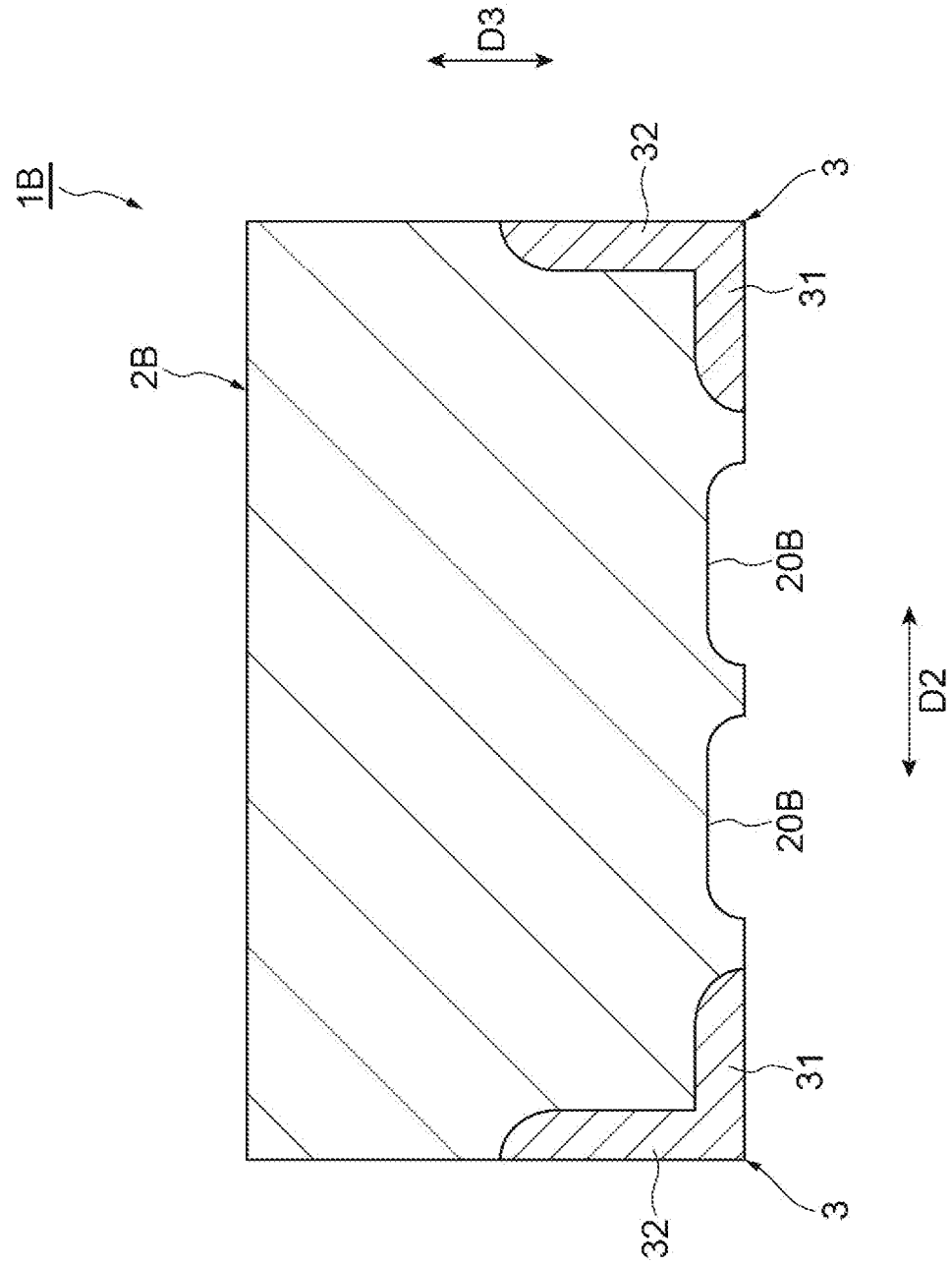
FIG. 6 is a diagram illustrating a cross-sectional configuration of a multilayer coil component according to another embodiment.

A form in which one groove portion 20 of the element body 2 is provided has been described as an example in the embodiment described above. However, an element body 2B may be provided with a plurality of (here, two) groove portions 20B as in a multilayer coil component 1B illustrated in FIG. 6. In this configuration, the element body 2 exists between the plurality of groove portions 20B, and thus the strength of the element body 2B can be ensured and the space between the element body 2B and the circuit board 110 can be appropriately filled with the mold resin 140.

Figure 7:
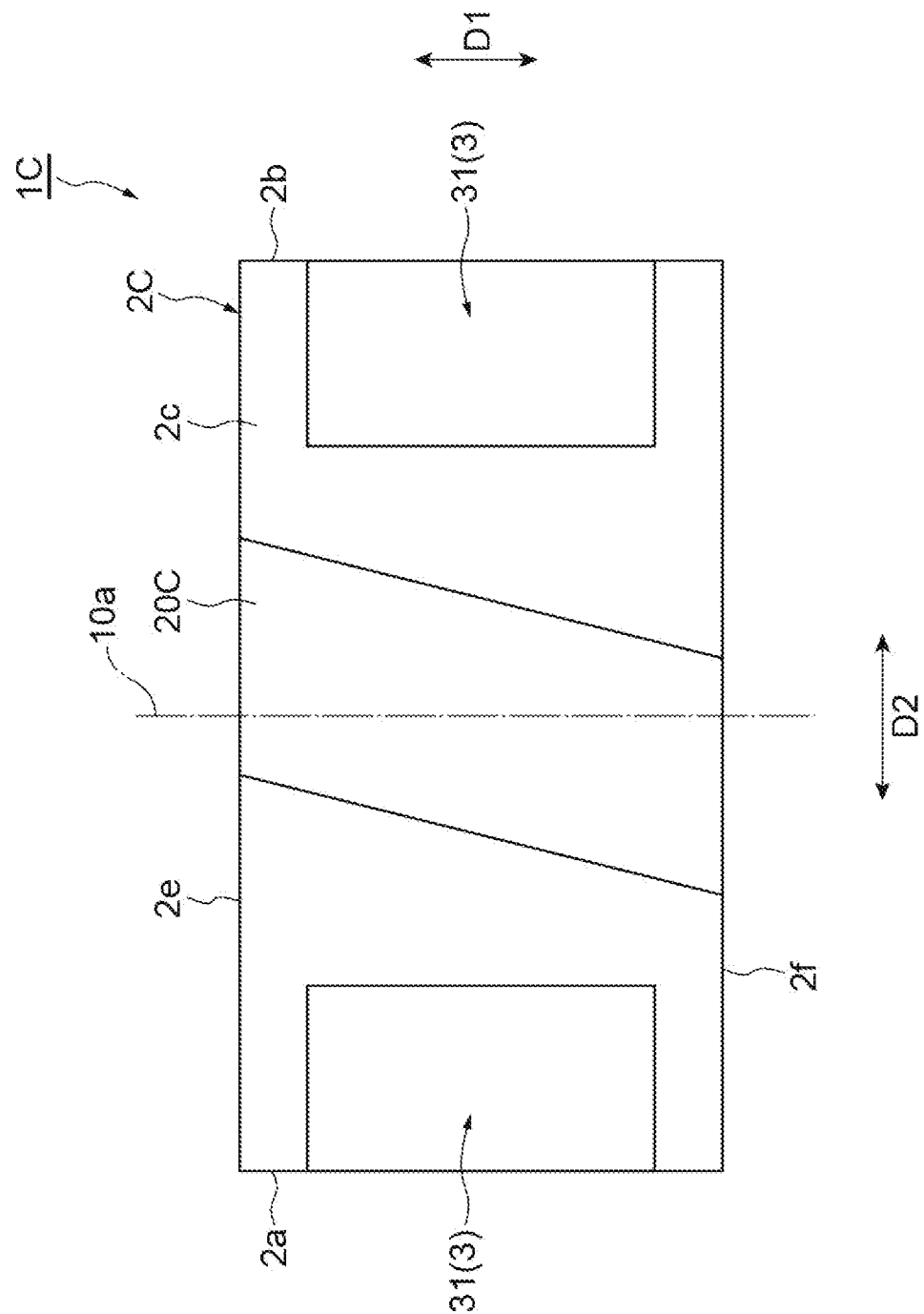
FIG. 7 is a diagram illustrating a multilayer coil component according to another embodiment.

A form in which the groove portion 20 is formed linearly along the first direction D1 has been described as an example in the embodiment described above. However, as in a multilayer coil component 1C illustrated in FIG. 7, a groove portion 20C provided in an element body 2C may extend so as to be inclined with respect to the first direction D1 so as to form a predetermined angle with the first direction D1 (coil axis 10*a*).

What is claimed is:

1. A multilayer coil component comprising:
an element body formed by laminating a plurality of insulator layers and having a pair of end surfaces facing each other, a pair of main surfaces facing each other, and a pair of side surfaces facing each other, one of the main surfaces being a mounting surface;
a coil disposed in the element body with a coil axis extending along a facing direction of the pair of side surfaces; and
a pair of terminal electrodes connected to the coil and disposed in recessed portions formed on the mounting surface on the respective end surface sides of the element body, wherein
the element body has a groove portion provided on the mounting surface,
the groove portion is disposed between the pair of terminal electrodes and extends to one of the side surfaces and to another one of the side surfaces, and
a maximum depth of the groove portion into the mounting surface and in a facing direction of the pair of main surfaces is smaller than a thickness of each of the pair of terminal electrodes extending into the recessed portions of the mounting surface, in the facing direction, and
wherein the multilayer coil component does not include any terminal electrode formed in the groove portion.

2. The multilayer coil component according to claim 1, wherein, in the pair of terminal electrodes, end portions facing each other in a facing direction of the pair of end surfaces are curved when viewed from the facing direction of the pair of side surfaces.

3. The multilayer coil component according to claim 1, wherein
the groove portion has a pair of side surface parts facing each other in a facing direction of the pair of end surfaces, a bottom surface part connecting the pair of side surface parts, and a connecting part connecting the pair of side surface parts and the bottom surface part, and
the connecting part is curved.

4. The multilayer coil component according to claim 1, wherein the groove portion is one of a plurality of groove portions that are provided.

5. The multilayer coil component according to claim 1, wherein the element body exists between the pair of terminal electrodes and the groove portion when viewed from the facing direction of the pair of side surfaces.

6. A multilayer coil component comprising:
an element body formed by laminating a plurality of insulator layers and having a pair of end surfaces facing each other, a pair of main surfaces facing each other, and a pair of side surfaces facing each other, one of the main surfaces being a mounting surface;
a coil disposed in the element body with a coil axis extending along a facing direction of the pair of side surfaces; and
a pair of terminal electrodes, each comprising first and second conductor parts disposed orthogonal to each other, and connected to the coil, the first conductor parts being disposed in first recessed portions formed on the mounting surface and the second conductor parts being disposed in second recessed portions formed on the end surfaces, wherein
the element body has a groove portion provided on the mounting surface, the groove portion is disposed between the pair of terminal electrodes and extends to one of the side surfaces and to another one of the side surfaces, and a maximum depth of the groove portion into the mounting surface and in a facing direction of the pair of main surfaces is smaller than a thickness of each of the first conductor parts extending into the first recessed portions of the mounting surface, in the facing direction, and wherein the multilayer coil component does not include any terminal electrode formed in the groove portion.

\* \* \* \* \*